US006304478B1

(12) United States Patent
Jain

(10) Patent No.: US 6,304,478 B1
(45) Date of Patent: Oct. 16, 2001

(54) LAYOUT FOR A SEMICONDUCTOR MEMORY

(75) Inventor: Raj Kumar Jain, Diamond Tower (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/615,987

(22) Filed: Jul. 14, 2000

(51) Int. Cl.[7] .................................................... G11C 5/02
(52) U.S. Cl. ................................ 365/51; 365/52; 365/149
(58) Field of Search .............................. 365/51, 52, 63, 365/149, 150

(56) References Cited

U.S. PATENT DOCUMENTS

| | | | | |
|---|---|---|---|---|
| 4,193,125 | * | 3/1980 | Moriya | 365/51 |
| 4,639,892 | * | 1/1987 | Mizugaki et al. | 365/51 |
| 5,394,354 | * | 2/1995 | Watabe et al. | 365/51 |
| 5,414,653 | * | 5/1995 | Onishi et al. | 365/149 |
| 5,541,872 | * | 7/1996 | Lowrey et al. | 365/149 |
| 5,764,588 | * | 6/1998 | Nogami et al. | 365/150 |
| 5,856,940 | * | 1/1999 | Rao | 365/149 |
| 5,963,468 | | 10/1999 | Rao | 365/149 |
| 6,067,265 | * | 5/2000 | Mukunoki et al. | 365/149 |
| 6,147,895 | * | 11/2000 | Kamp | 365/149 |

FOREIGN PATENT DOCUMENTS

| | | |
|---|---|---|
| 19845124C2 | 10/2000 | (DE) . |
| 0 024 874 A1 | 8/1980 | (EP) . |

OTHER PUBLICATIONS

Takashima, D. and Kunishima, "High–Density Chain Ferroelectric Random Access Memory", IEEE Journal of Solid State Circuits, 1998 Bd. 33, Nr.5, P. 787–792.

* cited by examiner

Primary Examiner—Tan T. Nguyen
(74) Attorney, Agent, or Firm—Dexter K. Chin

(57) ABSTRACT

The invention pertains to a layout for a semiconductor memory with multiple memory cells. The layout according to this invention takes into account the "design rules" specified by the manufacturing process or those required by the technology, and attempts to optimize the surface area of the layout of the semiconductor memory. The particular advantage of the invention rests in the fact that for each memory cell, effectively only one contact terminal is needed. In this manner, the required surface area for the semiconductor memory can be reduced significantly. Due to the reduction in the number of contact terminals, the leakage currents can also be reduced.

48 Claims, 2 Drawing Sheets

LAYOUT FOR A SEMICONDUCTOR MEMORY

FIELD OF THE INVENTION

The invention pertains to a layout for a semiconductor memory with multiple memory cells.

BACKGROUND OF THE INVENTION

Future microelectronic circuits will use complicated memory architectures with a total in the range of $10^{12}$ to $10^{15}$ transistors. For financial reasons, one elementary boundary condition is no doubt the desire to use the surface area of each of the memory cells optimally and also to obtain the best possible layout of the memory cells on the semiconductor chip. The size of an individual memory cell, the total number of memory cells and also their wiring extent are significant determining factors for defining the overall surface area of the semiconductor memory.

In particular with regard to the wiring, specific design rules must be followed, i.e., defined, specified instructions relating to the minimum spacing of the individual circuit paths and their contacts with each other. In particular, the size of the individual contacts plays a fundamental role since their lateral dimensions are specified as relatively large in comparison to the corresponding circuit paths..

The invention is thus based on the problem of defining a space-saving layout for a semiconductor memory.

SUMMARY OF THE INVENTION

The layout according to this invention takes into account the "design rules" specified by the manufacturing process or those required by the technology, and it attempts to optimize the surface area of the layout of the semiconductor memory. The particular advantage of the invention rests in the fact that for each memory cell, effectively only one contact terminal is needed. In this manner, the required surface area for the semiconductor memory can be reduced significantly. Due to the reduction in the number of contact terminals, the leakage currents can also be reduced.

The invention is particularly valuable for semiconductor memories with so-called dual-port memory cells. In this case, the two bit-line decoders can each be located at opposite sides of the cell field of the semiconductor memory. The different bit lines then lead the particular data signals in opposite directions. Due to this very favorable arrangement of the bit line decoder, the signal-to-noise ratio can be reduced significantly.

The additional claims relate to preferred embodiments and refinements of the invention.

BRIEF DESCRIPTION OF THE DRAWINGS

The invention will be explained in greater detail below with reference to the design examples presented in the figures. Shown are.

In the figures the same or functionally equivalent elements are assigned the same reference numbers, unless expressly stated otherwise.

DETAILED DESCRIPTION OF THE INVENTION

Figure 1:
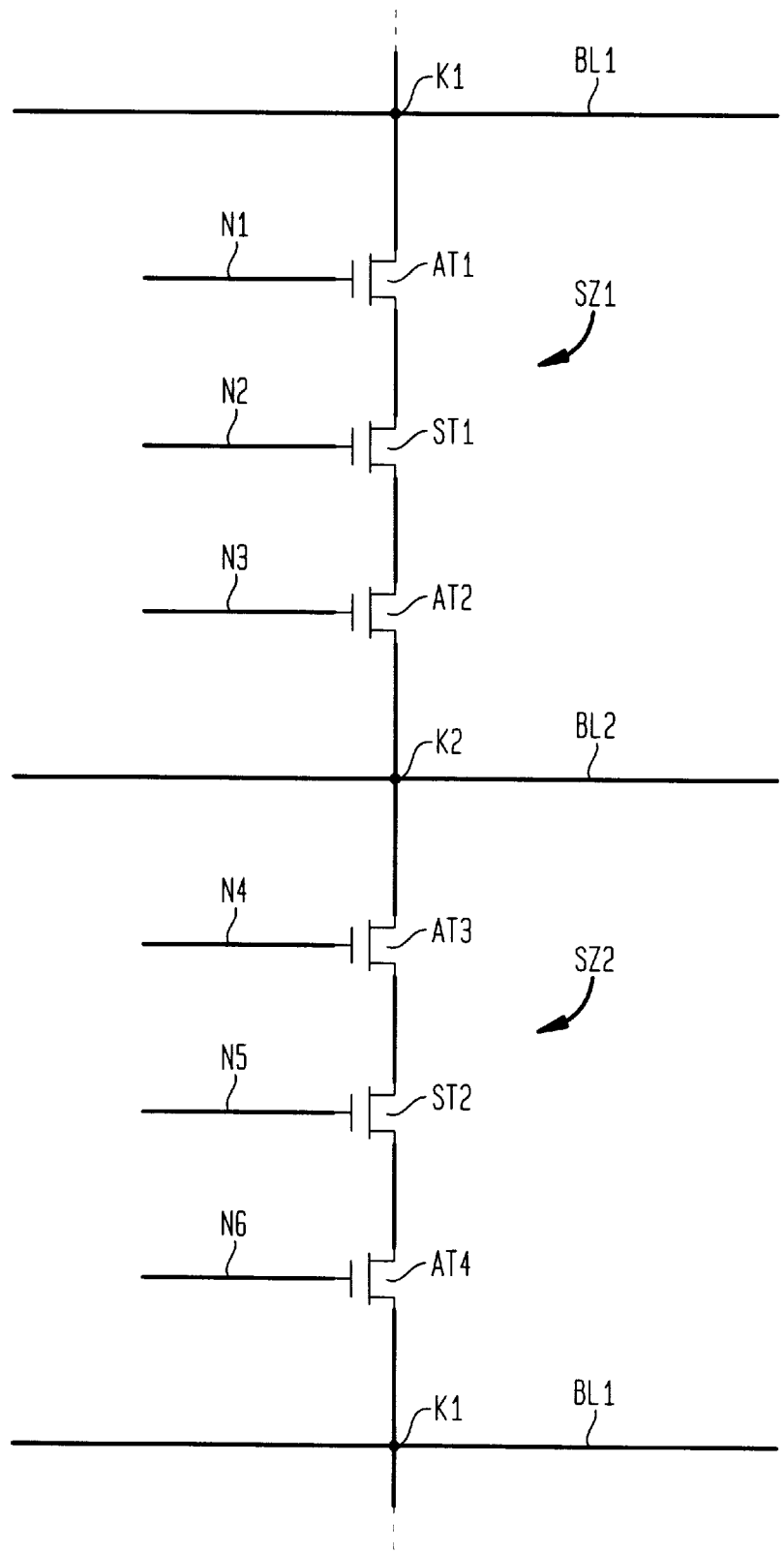
FIG. 1, a replacement wiring diagram of a semiconductor memory which shows sections of two neighboring memory cells.

FIG. 1 shows a replacement wiring diagram of a semiconductor memory, which illustrates sections of two neighboring memory cells SZ1, SZ2. Each of the memory cells SZ1, SZ2 features a capacitive element, which is formed here by a memory transistor ST1, ST2. Of course, it is also possible to form the capacitive element by a memory capacitor. In addition, each memory cell SZ1, SZ2 has two selection transistors [from those labeled] AT1 to AT4. The loading paths of the selection transistors AT1 to AT4 and the memory transistors ST1, ST2 of each memory cell SZ1, SZ2 are connected in series and form an output path A1, A2. In this case, one memory transistor ST1, ST2 is located between each of the corresponding selection transistors AT1 to AT4 of each memory cell SZ1, SZ2. The output paths A1, A2 of each memory cell SZ1, SZ2 are located between two bit lines BL1, BL2.

The memory cells SZ1, SZ2 are located between the bit lines BL1, BL2 in such a manner that neighboring memory cells SZ1, SZ2 are formed as mirror images of each other. Thus, neighboring memory cells SZ1, SZ2 each share one bit line BL1. In addition, neighboring memory cells are connected to the common bit line BL1 via the same contact terminal K1.

The control terminals of the selection transistors AT1 to AT4 and memory transistors ST1, ST2 are connected to control lines N1 to N6. In the selection transistors AT1 to AT4, these control lines N1, N3, N4, N6 are also called word lines. A selection signal can be sent over these word lines to the control terminals of the selection transistors AT1 to AT4. The control lines N2, N5 of the memory transistors ST1, ST2 typically carry power supply voltage, for example, the positive power supply voltage VDD.

In the present embodiment, the memory cells SZ1, SZ2 are designed as so-called dual-port memory cells. The term "dual-port memory cells" refers to all memory cells that have exactly two data lines. Static dual-port memory cells (dual-port SRAM) typically contain a total of eight transistors, with four of them selection transistors (transfer gates) and four memory transistors (inverter). Dynamic dual-port memory cells (dual-port DRAM) are still unknown. Due to the circuit arrangement according to FIG. 1, it is possible to prepare dual-port DRAM memory cells in a very simple manner as well as with the advantage that both terminals of the memory transistor (ST1, ST2 have a defined potential.

In a semiconductor memory with dual-port memory cells, the outputs of the bit lines BL1, BL2 are typically connected to two data processing units. These data processing units can be designed, for example, as microcomputers, processors, logic circuits, buses, etc. Typically, but not necessarily, the data processing units are operated at different clock frequencies. Bidirectional data can be written into or read out of the memory cells of the semiconductor memory over the bit lines BL1, BL2.

Of course, it is also possible to design memory cells SZ1, SZ2 as so-called single-port memory cells. The term "single-port memory cells" refers to all memory cells having exactly one data line. In this case, the other output line can be connected to a so-called precharging circuit (refresh circuit). This precharging circuit can then recharge the charge stored in the memory cells SZ1, SZ2 at regular time intervals. Thus the corresponding capacitive element ST1, ST2 of the corresponding memory cell SZ1, SZ2 will have an applied charge potential.

Figure 2:
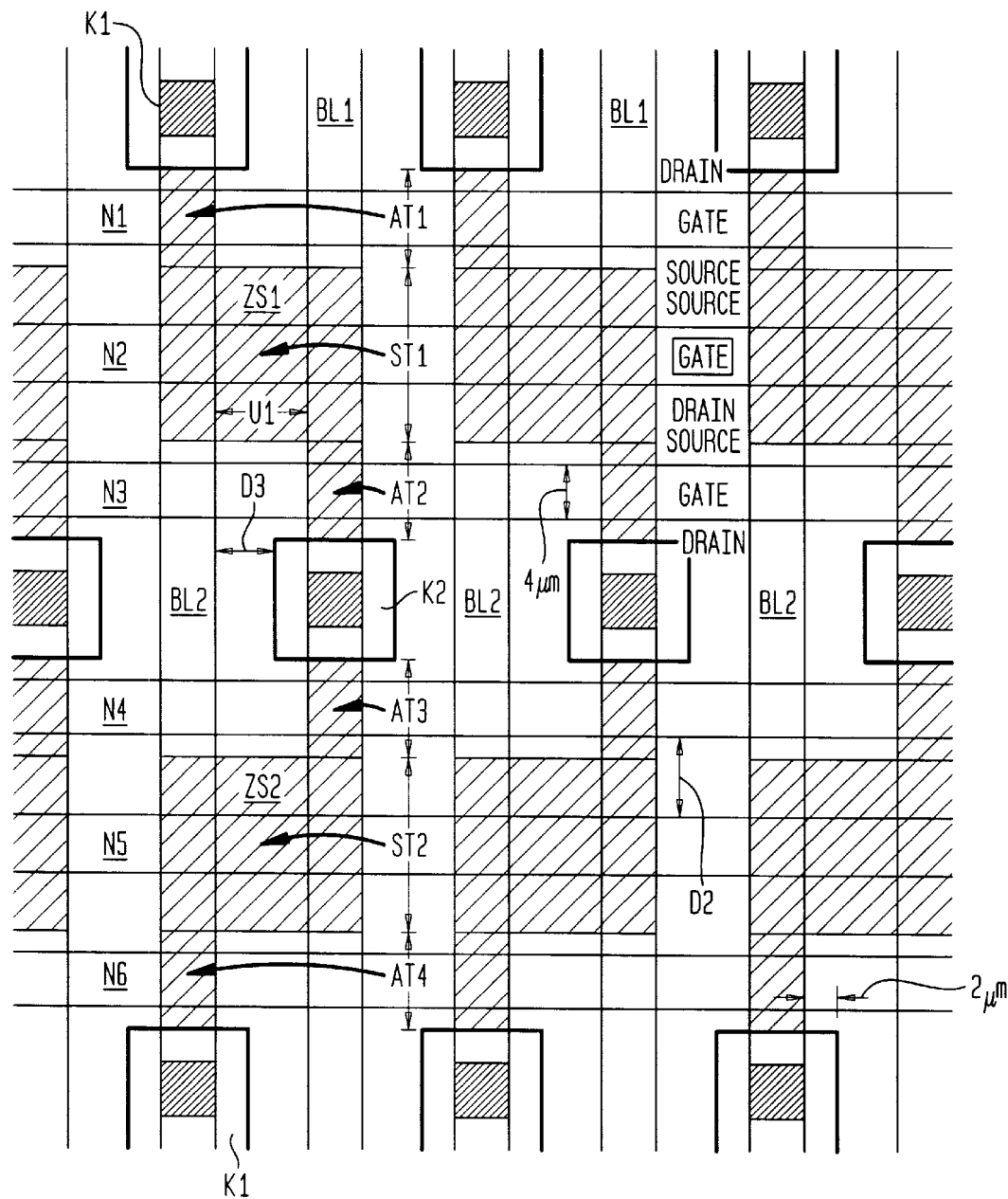
FIG. 2, a section from the layout of a semiconductor memory with multiple memory cells designed according to FIG. 1.

FIG. 2 shows a section from the layout of a semiconductor memory with multiple memory cells designed according to FIG. 1. The elements of the circuit array shown in FIG. 1 are illustrated only in part in FIG. 2.

FIG. 2 shows the line paths for the bit lines BL1, BL2, which are arranged in parallel to each other. Neighboring bit lines BL1, BL2 have a first minimum spacing D1 to each other. In addition, FIG. 2 shows the line paths for the control lines N1 to N6, which are likewise located side by side. The control lines N1 to N6 of one memory cell have a second spacing D2 to each other. In the layout of the semiconductor memory in FIG. 2, the control lines N1 to N6 are located perpendicular to the bit lines BL1, BL2. Typically, the bit lines are created by a metallic circuit path, while the control lines are usually formed by a polysilicon circuit path. The output paths A1, A2 of a memory cell SZ1, SZ2 are configured in an L-shape.

Furthermore, in FIG. 2 there are contact terminals K1, K2 used to connect the neighboring memory cells SZ1, SZ2 to the common bit lines BL1, BL2. These contact terminals K1, K2 are typically wider than the particular bit lines BL1, BL2. The control lines N1 to N6, and also the bit lines BL1, BL2, have a third minimum spacing D3 to the contact terminals.

The minimum spacings specified above are typically defined by the associated "design rules." In this regard, the thickness of the circuit paths, in particular, and their material are important factors.

While the invention has been particularly shown and described with reference to various embodiments, it will be recognized by those skilled in the art that modifications and changes may be made to the present invention without departing from the spirit and scope thereof. Merely by way of example, the invention can be useful for reducing the impact of coupling noise in any type of differential signal lines. The scope of the invention should therefore be determined not with reference to the above description but with reference to the appended claims along with their full scope of equivalents.

What is claimed is:

1. A layout for a semiconductor memory comprising:
   a plurality of memory cells in which a memory cell includes
   at least one selection transistor,
   at least one capacitive element, and
   a loading path having a first end and second end, the loading path defining an output path of the memory cell, and
   first and second output lines,
   first and second contacts coupling the first and second output lines to the first and second ends of the output path;
   wherein neighboring memory cells have output paths which are coupled in series; and
   wherein one of the output lines of two neighboring memory cells is a common output line.

2. The layout as in claim 1 wherein one of the first or second contacts of two neighhoring memory cells is a common contact, the common contact coupling the two neighboring memory cells to the common output line.

3. The layout as in claim 1 wherein a lateral projection of the output path of the memory cells comprises an L shape.

4. The layout as in claim 3 wherein one of the first or second contacts of two neighboring memory cells is a common contact, the common contact coupling the two neighboring memory cells to the common output line.

5. The layout as in claim 1 wherein circuit paths of the output lines are arranged in parallel and separated by a first minimum spacing.

6. The layout as in claim 5 wherein one of the first or second contacts of two neighboring memory cells is a common contact, the common contact coupling the two neighboring memory cells to the common output line.

7. The layout as in claim 5 wherein a lateral projection of the output path of the memory cells comprises an L shape.

8. The layout as in claim 7 wherein one of the first or second contacts of two neighboring memory cells is a common contact, the common contact coupling the two neighboring memory cells to the common output line.

9. The layout as in claim 1 wherein the memory cells comprise one selection transistor and that one of the output lines is a data line and other output line is a power supply line for a power supply voltage.

10. The layout as in claim 9 wherein one of the first or second contacts of two neighboring memory cells is a common contact, the common contact coupling the two neighboring memory cells to the common output line.

11. The layout as in claim 9 wherein a lateral projection of the output path of the memory cells comprises an L shape.

12. The layout as in claim 11 wherein one of the first or second contacts of two neighboring memory cells is a common contact, the common contact coupling the two neighboring memory cells to the common output line.

13. The layout as in claim 9 wherein circuit paths of the output lines are arranged in parallel and separated by a first minimum spacing.

14. The layout as in claim 13 wherein one of the first or second contacts of two neighboring memory cells is a common contact, the common contact coupling the two neighboring memory cells to the common output line.

15. The layout as in claim 13 wherein a lateral projection of the output path of the memory cells comprises an L shape.

16. The layout as in claim 15 wherein one of the first or second contacts of two neighboring memory cells is a common contact, the common contact coupling the two neighboring memory cells to the common output line.

17. The layout as in claim 1 wherein the memory cells comprise at least first and second selection transistors and the output lines comprise data lines.

18. The layout as in claim 17 wherein one of the first or second contacts of two neighboring memory cells is a common contact, the common contact coupling the two neighboring memory cells to the common output line.

19. The layout as in claim 17 wherein a lateral projection of the output path of the memory cells comprises an L shape.

20. The layout as in claim 19 wherein one of the first or second contacts of two neighboring memory cells is a common contact, the common contact coupling the two neighboring memory cells to the common output line.

21. The layout as in claim 17 wherein circuit paths of the output lines are arranged in parallel and separated by a first minimum spacing.

22. The layout as in claim 21 wherein one of the first or second contacts of two neighboring memory cells is a common contact, the common contact coupling the two neighboring memory cells to the common output line.

23. The layout as in claim 21 wherein a lateral projection of the output path of the memory cells comprises an L shape.

24. The layout as in claim 23 wherein one of the first or second contacts of two neighboring memory cells is a common contact, the common contact coupling the two neighboring memory cells to the common output line.

25. The layout as in claim 17 wherein one of the selection transistors is coupled a charging for charging the capacitive element with a charge potential.

26. The layout as in claim 25 wherein one of the first or second contacts of two neighboring memory cells is a common contact, the common contact coupling the two neighboring memory cells to the common output line.

27. The layout as in claim 25 wherein a lateral projection of the output path of the memory cells comprises an L shape.

28. The layout as in claim 27 wherein one of the first or second contacts of two neighboring memory cells is a common contact, the common contact coupling the two neighboring memory cells to the common output line.

29. The layout as in claim 25 wherein circuit paths of the output lines are arranged in parallel and separated by a first minimum spacing.

30. The layout as in claim 29 wherein one of the first or second contacts of two neighboring memory cells is a common contact, the common contact coupling the two neighboring memory cells to the common output line.

31. The layout as in claim 29 wherein a lateral projection of the output path of the memory cells comprises an L shape.

32. The layout as in claim 31 wherein one of the first or second contacts of two neighboring memory cells is a common contact, the common contact coupling the two neighboring memory cells to the common output line.

33. The layout as in one of the claims from 1–32 wherein gates of the selection transistors are coupled to first control lines.

34. The layout as in claim 33 wherein a lateral projection of the control lines are arranged essentially perpendicular to circuit paths of the output lines.

35. The layout as in claim 34 wherein a lateral projection of the control lines are arranged essentially perpendicular to circuit paths of the output lines.

36. The layout as in claim 33 wherein circuit paths of the control lines are arranged in parallel.

37. The layout as in claim 33 wherein the capacitive element comprises a memory capacitor.

38. The layout as in claim 37 wherein a lateral projection of the control lines are arranged essentially perpendicular to circuit paths of the output lines.

39. The layout as in claim 37 wherein circuit paths of the control lines are arranged in parallel.

40. The layout as in claim 39 wherein a lateral projection of the control lines are arranged essentially perpendicular to circuit paths of the output lines.

41. The layout as in claim 33 wherein the capacitive element comprises a transistor.

42. The layout as in claim 41 wherein a lateral projection of the control lines are arranged essentially perpendicular to circuit paths of the output lines.

43. The layout as in claim 41 wherein circuit paths of the control lines are arranged in parallel.

44. The layout as in claim 33 wherein a lateral projection of the control lines are arranged essentially perpendicular to circuit paths of the output lines.

45. The layout as in claim 33 wherein a gate of capacitive transistor is coupled to a second control line.

46. The layout as in claim 45 wherein a lateral projection of the control lines are arranged essentially perpendicular to circuit paths of the output lines.

47. The layout as in claim 45 wherein circuit paths of the control lines are arranged in parallel.

48. The layout as in claim 47 wherein a lateral projection of the control lines are arranged essentially perpendicular to circuit paths of the output lines.

* * * * *